United States Patent [19]

Olive et al.

[11] 4,093,852
[45] June 6, 1978

[54] LASER ADDRESSED DISPLAY

[75] Inventors: Graham Olive, Vancouver; Royston Ernest Walter Lake, Richmond; Joseph Guy Gilles Dionne, Ottawa, all of Canada

[73] Assignee: Her Majesty the Queen in right of Canada as represented by the Minister of National Defence, Ottawa, Canada

[21] Appl. No.: 727,882

[22] Filed: Sep. 29, 1976

[30] Foreign Application Priority Data

Jan. 30, 1976   Canada .................................. 244634

[51] Int. Cl.² ........................ H01J 31/50; H01J 39/12
[52] U.S. Cl. .......................... 250/213 A; 340/166 EL; 358/241
[58] Field of Search ............ 250/213 A; 340/166 EL; 358/241

[56] References Cited

U.S. PATENT DOCUMENTS

| | | | |
|---|---|---|---|
| 3,422,270 | 1/1969 | Moulton | 250/213 A |
| 3,947,842 | 3/1976 | Hilsum et al. | 250/213 A X |

Primary Examiner—Maynard R. Wilbur
Assistant Examiner—Richard E. Berger
Attorney, Agent, or Firm—Nathan Edelberg; Sheldon Kanars; Edward Goldberg

[57] ABSTRACT

A photoconductor-switched electroluminescent matrix panel for use in a laser-addressed tactical data display system in which photoconductor elements on the back of a screen are connected in series with electroluminescent display and feedback elements which form the front of the screen and an a-c power supply. The photoconductor has a high dark impedance so that in the initial OFF position insufficient a-c power passes through the electroluminescent elements to cause significant light emission. When the photoconductor is illuminated with a light pulse from a scanning laser beam, the impedance drops sharply so that substantially all of the a-c supply voltage is received by the electroluminescent element thereby causing the element to luminesce. The photoconductivity persists long enough for the electroluminescent emission to build up and sustain the low photoconductor impedance via optical feedback. This ON condition is maintained until the power to the device is interrupted for an erase period long enough for the photoconductivity to decay.

12 Claims, 6 Drawing Figures

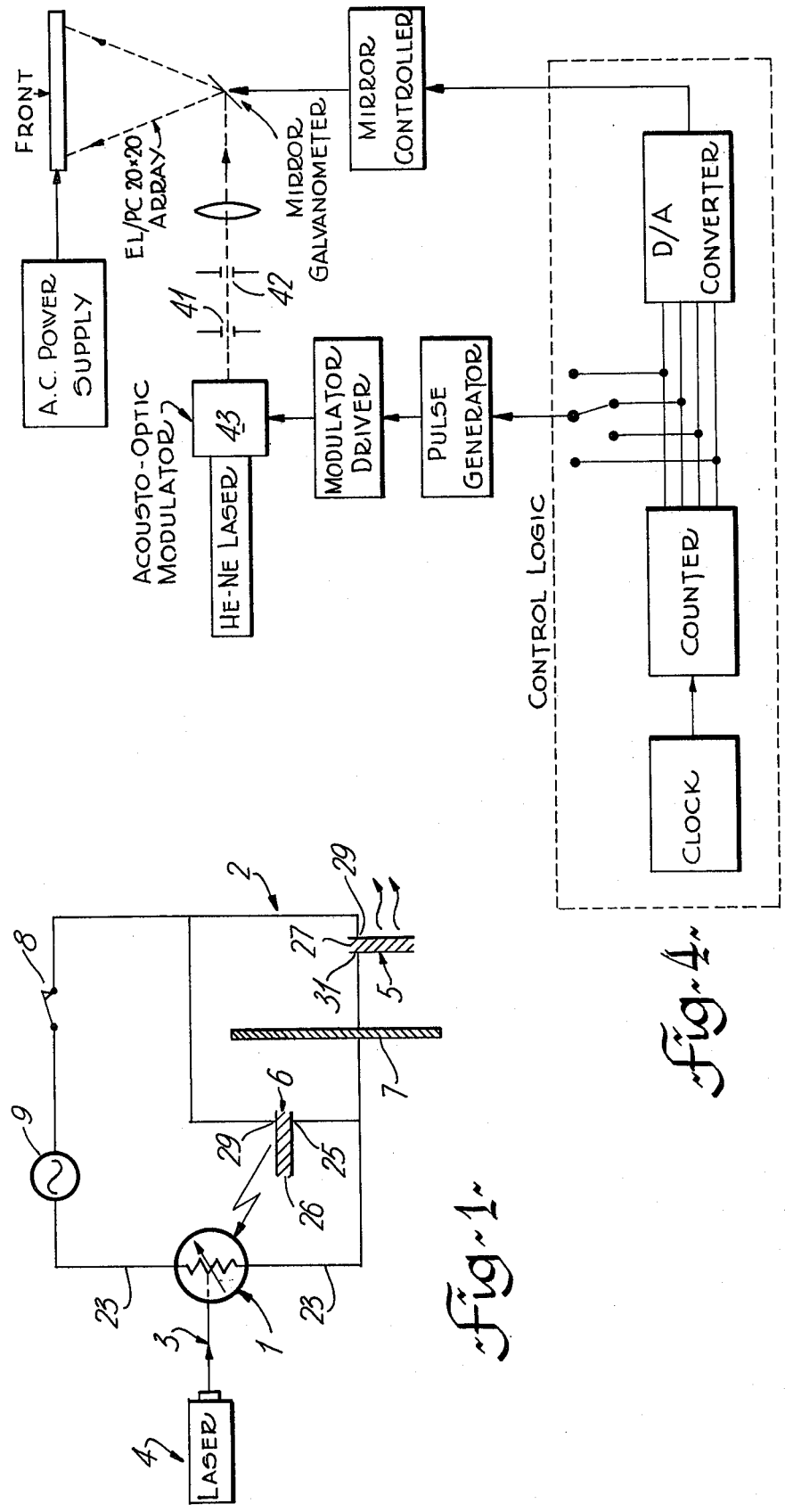

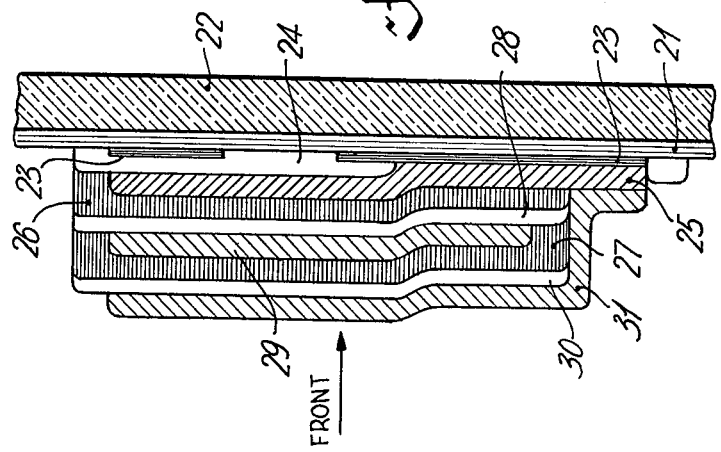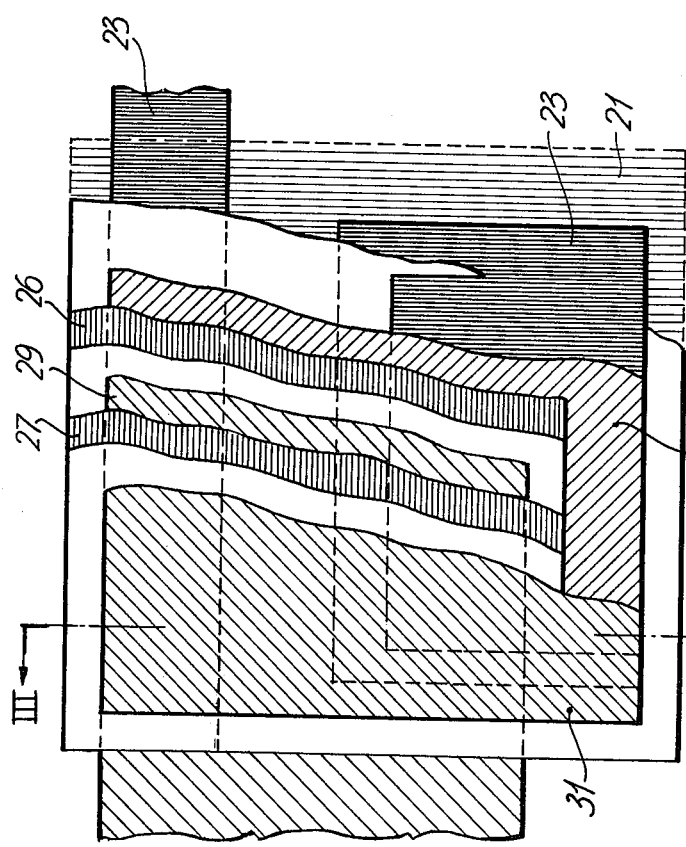

LASER ADDRESSED DISPLAY

This invention relates to display systems and in particular to electroluminescent large dot matrix screens for use in a tactical data display.

Large screen displays having an area greater than about three square feet are required for various command and control activities. Destriautype electroluminescent elements (EL) have often been used for large area displays and it is known that photoconductive elements (PC) can be used to actuate such electroluminescent elements, but a practical display system incorporating these elements in a single device has not heretofore been possible because of speed limitations imposed by photoconductor response times at the low addressing light intensities previously available.

It is an object, therefore, of this invention to provide a practical large screen display system which incorporates a plurality of electroluminescent elements which are switched by means of photoconductive elements such as those of the cadmium sulphide (CdS) type, and which has an acceptable updating time.

It has been found that the disadvantages of the prior art can be overcome and the object of this invention achieved by incorporating inherent storage at the readout level, using a scanned laser beam for addressing the photoconductive elements and by modularizing the display to provide random access at the module level. The use of a scanned laser beam for addressing has the major advantage of drastically reducing the number of electrical connections, which can be large even in an x-y addressed system, because each module requires only two external connections.

Thus, by one aspect of this invention there is provided a photoconductor-switched electroluminescent matrix panel element for use in a laser addressed display system comprising: a photoconducting layer, deposited on a transparent substrate, electrically and optically coupled with a superimposed parallel plate capacitor structure having at least two dielectric layers with a common electrode, said dielectric layers containing phosphor particles which emit visible radiation upon excitation by an alternating electric current; said photoconducting layer having a dark impedance such that insufficient alternating current may pass through said capacitor structure to cause significant visible radiation emission and a light impedance such that when addressed by an incident light pulse sufficient alternating current may pass through said capacitor structure to cause visible radiation emission; said photoconductor layer being adapted to maintain a sufficiently low light impedance, for a time period after said light pulse, to permit feed back of light emitted from one of said dielectric layers to build up and thereby sustain said low light impedance until interruption of said alternating electric current.

By another aspect of this invention there is provided a photoconductor-switched electroluminescent laser addressed display system comprising: (a) an a-c power supply; (b) a matrix panel comprising a plurality of elements each comprising a photoconducting layer, deposited on a transparent substrate, electrically and optically coupled with a superimposed parallel plate capacitor structure having at least two dielectric layers with a common electrode, said dielectric layers containing phosphor particles which emit visible radiation upon excitation by an alternating electric current; said photoconducting layer having a dark impedance such that insufficient alternating current passes through said capacitor structure to cause significant visible radiation emission and a light impedance such that when addressed by an incident light pulse sufficient alternating current passes through said capacitor structure to cause visible radiation emission; said photoconductor layer being adapted to maintain a sufficiently low light impedance, for a time period after said light pulse, to permit feed back of light emitted from one of said dielectric layers to build up and thereby sustain said low light impedance until interruption of said alternating electric current; (c) a scanning laser including means to optically scan said plurality of matrix panel elements and address an incident light pulse to selected panel elements; and (d) means to interrupt said a-c power supply for at least sufficient time for photoconductivity in said photoconductive layer to decay.

The invention will be described in more detail hereinafter with reference to the accompanying drawings in which:

FIG. 1 is a schematic of the circuit for one element of the display matrix;

FIG. 2 is a front view, partly in section, of a single element EL/PC device with separate feedback and readout sections, according to the present invention;

FIG. 3 is a section through the element of FIG. 2 taken along line III—III;

FIG. 4 is a schematic of the laser beam deflection and control system for scanned addressing tests;

Figure 5:
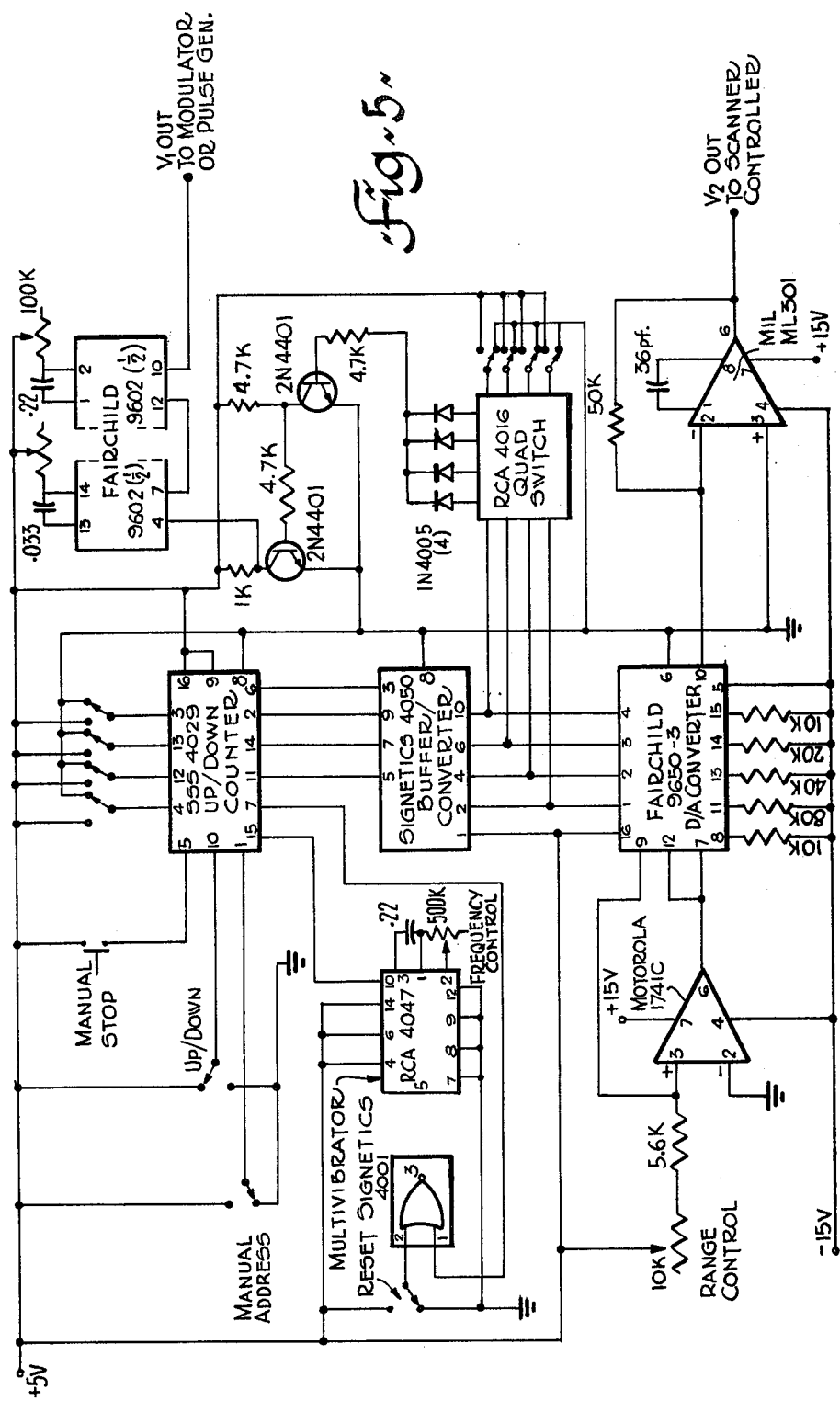
FIG. 5 is a schematic of the control logic for an optical scanner and modulator system used in testing and demonstrating the present invention.

Turning firstly to FIG. 1 which shows schematically the circuit for one element of the display matrix. Individual photoconductor elements 1 preferably of the thin film CdS:Cu,Cl, vacuum deposited on glass substrate type, are arranged in series with an electroluminescent element 2 of the dot matrix, and addressed sequentially by a laser beam 3, from laser 4, scanning the display panel from the rear. The electroluminescent elements 2 comprise parallel plate capacitor structures in which the dielectric layers 5 and 6, separated by an opaque wall 7, contain phosphor particles, generally non-uniformly distributed therethrough, which emit visible radiations when subjected to an alternating electric field. In the initial OFF state, the switch 8 is closed so that a-c power, from source 9 (e.g. 100 V rms at 2 kHZ), is applied across the EL/PC combination. The dark impedance of the PC element 1 is sufficiently high so that the small a-c voltage across the EL element 2 does not produce any significant light emission. When a suitable light pulse 3 from laser 4 is incident upon PC element 1, its impedance falls to a value much smaller than the impedance of EL element 2 so that the latter receives almost all of the supply voltage, and layers 5 and 6 electroluminesce. Layer 5 constitutes the display screen and layer 6 constitutes an optical feedback element. The photoconductivity persists long enough for the EL emission to build up in layer 6 so that, by optical feedback, the low PC impedance in element 1 is maintained, thus latching the device in the ON state. This condition can be maintained until the a-c power to the device is interrupted, by opening switch 8, for an erase period of sufficient duration, usually of the order of 5 seconds or less, for the photoconductivity to decay.

The bistable capability of the system avoids the normal requirement in non-storage scanned systems of very high instantaneous output brightness from the display elements during the limited address (excitation) time. Furthermore, with addressing light of sufficient intensity as is possible with a laser beam, the addressing pulses can be quite short and of the order of a few microseconds. The maximum writing rate is determined by this pulse duration together with the speed of the light beam deflection system rather than by the response time of the photoconductor.

In order to prevent ambient light incident on the front of the display affecting the PC element, and to reduce optical cross talk, an opaque screen 7 is placed between phosphor layers 5 and 6.

FIGS. 2 and 3 illustrate the geometry of a single EL/PC device approximately 0.01-0.02 sq. ins. in area. The photoconductor material 21, usually a 4$\mu$m thin film of CdS:Cu,Cl, is deposited on a glass substrate 22 and a simple lateral gap design PC element is defined by deposited gold electrodes 23. The spectral response of a PC element of this configuration is well matched to the green emission of the superimposed EL phosphor layer 25 and is adequate for addressing purposes at 40% of the peak value at 633$\mu$m, the HeNe laser wavelength. A clear epoxy resin insulator layer 24 separates the gold electrodes 23. A semi-transparent indium oxide powder in an organic binder feedback electrode 25 of the order of 0.0005 inch thick is then deposited over the electrodes 23 and layer 24. A feedback phosphor layer 26 is applied and separated from a second or readout phosphor layer 27 by a clear epoxy insulator layer 28 and an opaque vacuum deposited aluminum or gold common EL electrode 29 of the order of 1000 A – 10,000 A thick. A further clear epoxy insulation layer 30 is provided over phosphor layer 27 and a semi-transparent gold readout electrode 31 overlies the preceding layers and forms the front surface of the device. A-c power is applied between the gold PC busbar electrode 23 and the common EL busbar electrode 29, and the overlap of the latter with the individual semi-transparent electrodes defines the EL emission areas. The intermediate buffer layers 28 and 30 of epoxy resin and the use of evaporated thin metal films for all electrodes except the feedback-semi-transparent electrode were found to be desirable to avoid electrical breakdown problems. However, when individual elements were formed into 3 × 3 arrays it was found that the arrays exhibited optical cross talk due to channelling of feedback light in the transparent epoxy layer covering the PC film. This problem can be controlled by dividing the epoxy layer into transparent window areas over the PC gaps surrounded by a black light-absorbing grid pattern. When the grid was incorporated it was found that 3 × 3 element EL/PC arrays which operated at 100V, 2 kHz with readout brightness of 20 fl, could be addressed with 1 mW, 5$\mu$s HeNe pulses without optical cross talk, and had erase times below 0.05 secs. Also, in order to provide additional immunity to ambient illumination reaching the front of the array a black, light absorbing epoxy layer (not shown) may be introduced between layers 28 and 29 or 27 and 29.

A 20 × 20 element EL/PC array at 10 lines/inch density was prepared by the same vacuum evaporation and silk screening techniques which were employed for the production of the 3 × 3 arrays and which are well known to those skilled in the art. Upon testing all 400 elements were found to be operational. The sample was evaluated for readout brightness, ON element current, laser address pulses and evaluation of cross talk using both the laser and a fibre optic light source.

For address and cross talk characterization tests, under scanned beam conditions when the time interval between successive laser pulses on neighbouring elements was quite short, a single axis mirror scanner and control circuitry were assembled into a deflection system shown schematically in FIG. 4.

The deflection system consisted of a General Scanning model G-100 PD Optical Scanner (moving iron galvanometer plus capacitive position transducer) driven by a General Scanning model CCX-100 Servo Controller. The latter accepted input position commands in the form of analog voltages, and control circuitry was designed and assembled to generate a staircase ramp signal for stepping the laser beam through 16 equidistant angular positions. The circuitry, shown schematically in FIG. 5, could operate in repetitive or single scan mode and also provided a synchronised modulator control pulse which could be programmed to occur at every beam rest position, or at every second, every fourth or every eighth beam position.

The galvanometer response time was approx. 1 ms, and this limited the maximum scan rate to approx. 2 ms per step, with the modulator control pulse set to occur near the end of the step period.

To improve the extinction ratio of the modulation system for addressing purposes two iris diaphragms 41 and 42 were positioned after the modulator 43 to minimize the laser flare light present in the "beam off" state. The diaphragms also reduced the 'on' beam power to about 1mW, and under these conditions PC rise times of about 150$\mu$s were obtained.

Figure 6:
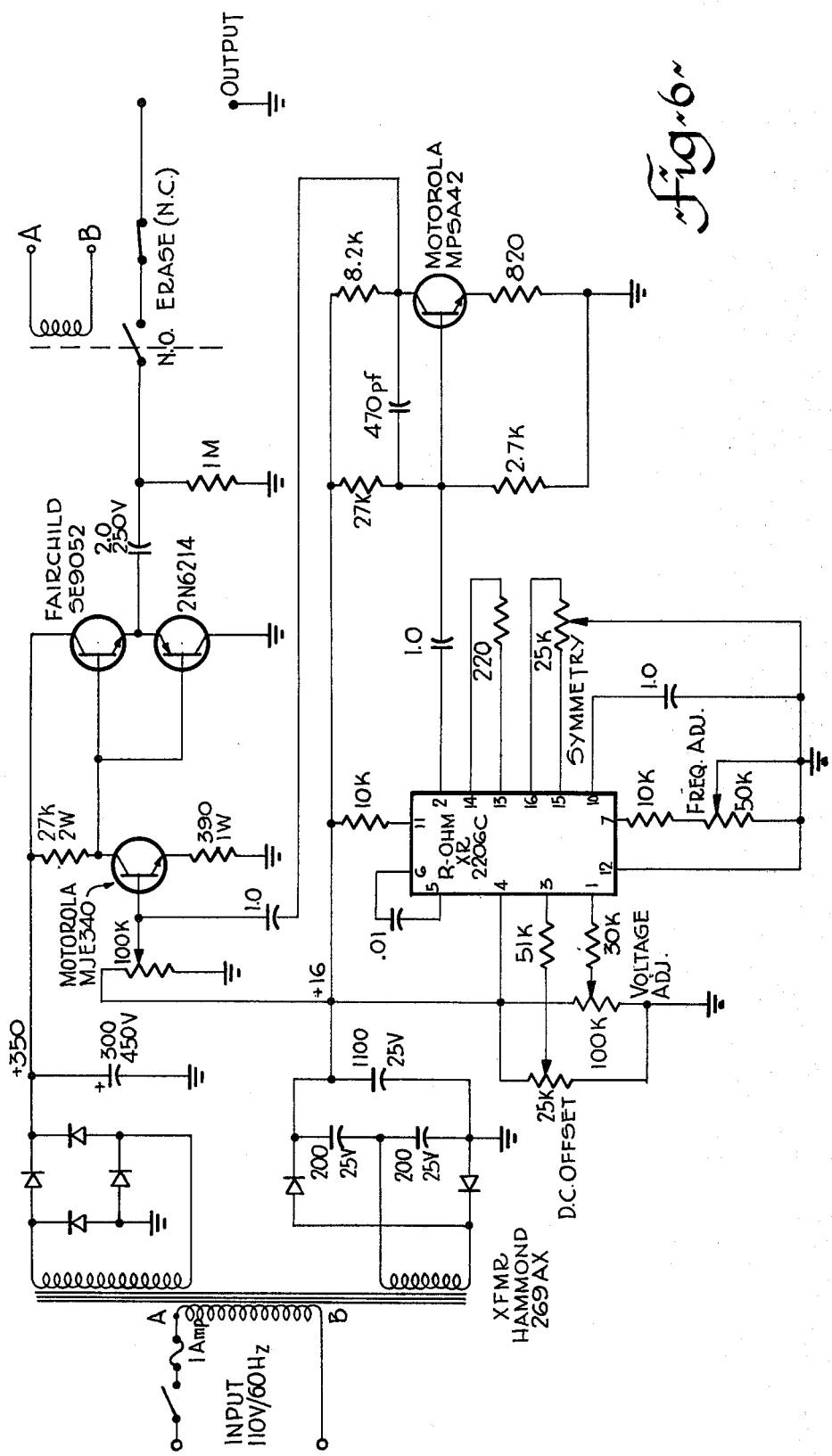
FIG. 6 is a schematic circuit diagram of one form of power supply, used to test and demonstrate the present invention.

The a-c power supply used to drive the 20 × 20 EL/PC array is shown diagrammatically in FIG. 6. It utilizes a monolithic chip function generator and delivers a nominal sine wave output up to 150 V pk. Apart from providing suitable output frequency and voltage values, it was necessary for this supply to have adequate regulation under the largely capacitive and widely varying load conditions presented by the EL/PC array samples. The delay on operate relay prevented possible damage to the samples due to the dc component present during initial charging of the output capacitor. The results are summarized in Table 1 below.

Table 1

Operating performance of 20 × 20 element EL/PC array (drive conditions 100 Vrms, 2kHz sine wave unless otherwise noted; address light power 1.1 mW)

| PARAMETER | |
|---|---|
| OFF state maintained to | >140V |
| ON state maintained down to | 85V |
| Minimum address pulse length: | |
| (a) individual aligned element | 10$\mu$s |
| (b) scanned address of 16 elements | 20$\mu$s |
| Readout element brightness* | 10 fL |
| Mean element current** | 35$\mu$A |
| Estimated erase time | 0.5s |
| Memory | Latched state maintained until erased by power interruption |
| Crosstalk | See Text |

*Semitransparent gold front electrode thickness not optimized.
**Higher values measured on 3 × 3 arrays included significant contributions from stray capacitances.

As already mentioned, all 400 elements operated correctly, that is, each element held off, could be individually addressed and latched on, and remained on until erased by interruption of the power to the panel. The short addressing pulse lengths and erase times demonstrate the adequate speed capabilities of the EL/PC display screen system, and the power consumption is also usefully low, extrapolating to a current of 6.25 A (30% power factor) at 100 V, 2 kHz for a 3 ft. × 4 ft. screen with 10 lines/inch.

The variation of optical cross talk sensitivity with position in this sample correlated with the previously determined PC element impedance values, i.e. areas where the impedance values were low, the upper left hand portions were the most sensitive to crosstalk. The main region of the sample was less prone to crosstalk, and it was possible to write messages and designs into the sample, providing the density of ON elements was not too high in the critical areas. It is clear that further improvements would result from better PC film uniformity and impedance matching.

It tests using the scanning system it was found that, presumably due to galvanometer non-linearities, the laser beam could not be positioned equally centrally on all of the 16 selected PC gap elements, and this misalignment necessitated the use of 1 mW laser pulses up to 50μs long for reliable latching of all 16 elements in a single scan. Alternate elements could be turned on at the maximum scan rate without optical crosstalk to the bypassed elements, and this could be repeated in adjacent rows with the pattern staggered to produce a checkerboard result. Generally it was found that addressing all elements in alternate rows resulted in some crosstalk.

It will be appreciated, from Table 1, that the manufacture of photoconductor-switched electroluminescent 20 × 20 matrix panels for a laser addressed display system has been accomplished at 10 lines/inch. With minor fabrication modifications and optimization of the laser beam deflection system, higher resolutions up to say 20 lines/inch and element brightness in the range 10–20 ft. Lamberts are readily obtainable.

We claim:

1. A photoconductor-switched electroluminescent matrix panel element for use in a laser addressed display system comprising: a photoconducting layer, deposited on a transparent substrate, electrically and optically coupled with a superimposed parallel plate capacitor structure having at least two dielectric layers with a common electrode, said dielectric layers containing phosphor particles which emit visible radiation upon excitation by an alternating electric current; said photoconducting layer having a dark impedance such that insufficient alternating current may pass through said capacitor structure to cause significant visible radiation emission and a light impedance such that when addressed by an incident light pulse provided by a laser source sufficient alternating current may pass through said capacitor structure to cause visible radiation emission; said photoconductor layer being adapted to maintain a sufficiently low light impedance, for a time period after said light pulse, to permit feedback of light emitted from one of said dielectric layers to build up and thereby sustain said low light impedance until interruption of said alternating electric current.

2. A matrix panel element as claimed in claim 1 wherein two said dielectric layers comprise a feedback layer adjacent said photoconducting layer and a readout layer remote from said photoconducting layer with said common electrode disposed between said feedback and said readout layer.

3. A matrix panel element as claimed in claim 1 wherein said common electrode is optically opaque.

4. A matrix panel element as claimed in claim 2 including a plurality of insulating layers interspersed between said photoconducting layer, said common electrode and said dielectric layers.

5. A matrix panel element as claimed in claim 4 including a semi-transparent feedback electrode between said photoconducting layer and said feedback layer and a semi-transparent readout electrode superimposed on said readout layer and electrically insulated from said common electrode.

6. A matrix panel element as claimed in claim 5 including a vacuum deposited gold electrode on said photoconducting layer for connection to said alternating electric field and in electrical contact with said feedback electrode.

7. A photoconductor-switched electroluminescent laser addressed display system comprising:
 (a) an a-c power supply;
 (b) a matrix panel comprising a plurality of elements each comprising a photoconducting layer, deposited on a transparent substrate, electrically and optically coupled with a superimposed parallel plate capacitor structure having at least two dielectric layers with a common electrode, said dielectric layers containing phosphor particles which emit visible radiation upon excitation by an alternating electric current; said photoconducting layer having a dark impedance such that insufficient alternating current passes through said capacitor structure to cause significant visible radiation emission and a light impedance such that when addressed by an incident light pulse sufficient alternating current passes through said capacitor structure to cause visible radiation emission; said photoconductor layer being adapted to maintain a sufficiently low light impedance, for a time period after said light pulse, to permit feedback of light emitted from one of said dielectric layers to build up and thereby sustain said low light impedance until interruption of said alternating electric current;
 (c) a scanning laser including means to optically scan said plurality of matrix panel elements and address an incident light pulse to selected panel elements; and
 (d) means to interrupt said a-c power supply for at least sufficient time for photoconductivity in said photoconductive layer to decay.

8. A display system as claimed in claim 7 wherein a plurality of panel elements are arranged in a symmetrical array to form a display panel having at least 10 elements per linear inch.

9. A display system as claimed in claim 8 including optical isolating means between individual panel elements.

10. A display system as claimed in claim 9 wherein said laser is a HeNe laser of at least 1mW power modulated to provide up to about 50μs pulses of light.

11. A display system as claimed in claim 10 wherein said a-c power supply is at 100 V, 2kHz.

12. A display system as claimed in claim 11 including a light absorbing layer adjacent said common electrode.

* * * * *